United States Patent
Takagi

(10) Patent No.: US 7,592,632 B2
(45) Date of Patent: Sep. 22, 2009

(54) LIGHT EMITTING DEVICE AND DISPLAY DEVICE USING THE SAME

(75) Inventor: Akinari Takagi, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 79 days.

(21) Appl. No.: 11/860,960

(22) Filed: Sep. 25, 2007

(65) Prior Publication Data

US 2008/0073661 A1    Mar. 27, 2008

(30) Foreign Application Priority Data

Sep. 27, 2006   (JP)   ............... 2006-262378

(51) Int. Cl.
*H01L 29/16*   (2006.01)
*H01S 3/04*   (2006.01)
*G02B 6/10*   (2006.01)

(52) U.S. Cl. .............. 257/82; 257/94; 257/441; 257/449; 257/E33.023; 257/E33.048; 372/43.01; 372/44.011; 372/50.1; 372/92; 385/129; 385/130; 385/131

(58) Field of Classification Search ............ 257/94, 257/82, 441, 449, E33.023, E33.048; 385/129, 385/130, 131; 372/43.01, 44.011, 50.1, 92
See application file for complete search history.

(56) References Cited

U.S. PATENT DOCUMENTS

| | | | | |
|---|---|---|---|---|
| 6,134,043 | A | 10/2000 | Johnson et al. | ............. 359/237 |
| 6,392,787 | B1 | 5/2002 | Cirelli et al. | ................. 359/321 |
| 6,993,235 | B2 * | 1/2006 | Takagi et al. | ................. 385/129 |
| 7,085,467 | B2 * | 8/2006 | Ikemoto et al. | ............. 385/129 |
| 7,151,629 | B2 * | 12/2006 | Takagi et al. | ................. 359/321 |
| 7,184,642 | B2 * | 2/2007 | Hoshi et al. | ................. 385/129 |
| 7,209,622 | B2 * | 4/2007 | Hoshi et al. | ................. 385/129 |
| 7,274,849 | B2 * | 9/2007 | Nobayashi et al. | .......... 385/131 |
| 7,302,147 | B2 * | 11/2007 | Takagi et al. | ............... 385/129 |
| 2002/0050600 | A1 * | 5/2002 | Hayakawa | .................... 257/89 |
| 2006/0083477 | A1 * | 4/2006 | Takagi et al. | ................. 385/147 |

FOREIGN PATENT DOCUMENTS

JP   8-316528   11/1996

OTHER PUBLICATIONS

Yablonovitch, E., "Inhibited Spontaneous Emission in Solid-State Physics and Electronics", Physical Review Letters, vol. 58, No. 20, pp. 2059-2062 (May 18, 1987).

* cited by examiner

*Primary Examiner*—Long K Tran
(74) *Attorney, Agent, or Firm*—Fitzpatrick, Cella, Harper & Scinto

(57) ABSTRACT

A small-sized and high-efficiency light emitting device capable of easily emitting green light includes a resonator including a photonic crystal having a refractive-index periodic structure and a point defect member formed in the photonic crystal to disturb the refractive-index periodic structure, and an active member provided inside the resonator and formed by an In containing nitride semiconductor, wherein a wavelength determined by a band gap energy of the active member is included in a photonic band gap range of the photonic crystal, and is set to be shorter than a peak wavelength at a shortest-wavelength side of a resonance mode of the resonator in the photonic band gap range.

12 Claims, 14 Drawing Sheets

LIGHT EMITTING DEVICE AND DISPLAY DEVICE USING THE SAME

FIELD OF THE INVENTION AND RELATED ART

This invention relates to a light emitting device such as a light emitting diode (LED) having a photonic crystal or a semiconductor laser (LD), for example, and a display device using the same.

It is known that the transmission/reflection characteristic of electromagnetic waves can be controlled when a structure not larger than the wavelength is periodically arranged (Physical Review Letters, Vol. 58, pp. 2059, 1987). By making small the period of the structure to an order of the wavelength of light, the transmission/reflection characteristic of light can be controlled. Such a structure is known as photonic crystal. It is suggested that a mirror having approximately 100% reflectance in a certain wavelength region can be realized if such photonic crystal is used. The wavelength band in which approximately 100% reflectance can be realized is called "photonic band gap" (PBG), in comparison with the energy gap of semiconductors.

Various structures presenting such a photonic band gap have been proposed (U.S. Pat. Nos. 6,392,787 and 6,134,043).

Furthermore, if a three-dimensional fine periodic structure is used, the photonic band gap can be accomplished with respect to light incident from any direction. This is called "complete photonic band gap". When an isolated point defect member is provided in a structure having a complete photonic band gap, a micro resonator having a high confining effect can be realized. There is a proposal which uses a micro resonator having a structure such as described above, to control spontaneous emission in the light emitting device, realizing a high-efficiency light emitting device.

On the other hand, LEDs and LDs are utilized as a high-efficiency and high-luminance light source for constituting a display device. For full-color image display, a light source that emits light of three primary colors of red, green and blue is necessary. Small-size and high-power LEDs or LDs using a compound semiconductor such as AlGaAs or GaP in an active layer (for the red light source) or AlGaN or InAlGaN (for the blue light source), are utilized. For the green light source, on the other hand, light emitting devices based on an LED using InGaN in an active layer or light emitting devices using SHG (second harmonic) of an LD-excited (pumped) solid-state laser are utilized.

Among these light emitting devices, light emitting devices using InGaN should have an enlarged In composition ratio to make the value of band-gap energy of the active layer coincident with the green-color wavelength band (500-550 nm). However, if the In composition ratio is enlarged, the crystallinity deteriorates, causing problems of decreased luminous efficiency and unstable light emission.

In order to avoid this problem, a method has been proposed by which an impurity such as Zn is doped to obtain green light emission based on the light emission through the level of the impurity.

Furthermore, a method has been proposed to improve the lowered power and decreased color purity which are the inconveniences involved in the abovementioned method. For example, a method of manufacturing a nitride semiconductor light emitting device has been proposed, by which, based on a tensile-strained quantum well, a wavelength longer than the band-gap energy assumed from the composition ratio of the active layer is emitted (Japanese Laid-Open Patent Application No. 08-316528). This patent documents discloses a light emitting device in which the thickness of the InGaN quantum well active layer is made very small and, based on the lattice mismatch with respect to the AlGaN clad layer contacting thereto, a lattice strain is applied to the InGaN active layer, whereby the emission wavelength is made longer.

In the nitride semiconductor light emitting device proposed in Japanese Laid-Open Patent Application No. 08-316528, the light emitting device uses InGaN. The impurity doping method disclosed in Japanese Laid-Open Patent Application No. 08-316528 has problems of low-efficiency and short lifetime. Furthermore, the method based on applying the lattice strain involves problems of cracks at the lattice mismatch during crystal growth as well as resultant difficulties in manufacture.

Furthermore, the light emitting devices using a solid state laser involve problems that the light emitting device is liable to become bulky because a large number of component parts are used, and that the luminous efficiency is low and the power consumption is large.

On the other hand, for conventional semiconductor lasers using a photonic crystal, approaches for realizing low-threshold oscillation and high efficiency have been attempted in relation to a system in which the wavelength determined by the band-gap energy of the active layer and the resonance mode peak wavelength of the resonator are matched each other.

SUMMARY OF THE INVENTION

The present invention provides a small-size and high-efficiency light emitting device by which green light can be emitted easily, and a display device having such light emitting device.

In accordance with an aspect of the present invention, there is provided a light emitting device, comprising: a resonator including a photonic crystal having a refractive-index periodic structure and a point defect member formed in said photonic crystal to disturb said refractive-index periodic structure; and an active member provided inside said resonator and formed by an In containing nitride semiconductor; wherein a wavelength determined by a band gap energy of said active member is included in a photonic band gap range of said photonic crystal, and is set to be shorter than a peak wavelength at a shortest-wavelength side of a resonance mode which said resonator bears in the photonic band gap range.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Embodiment 1

Figure 1:
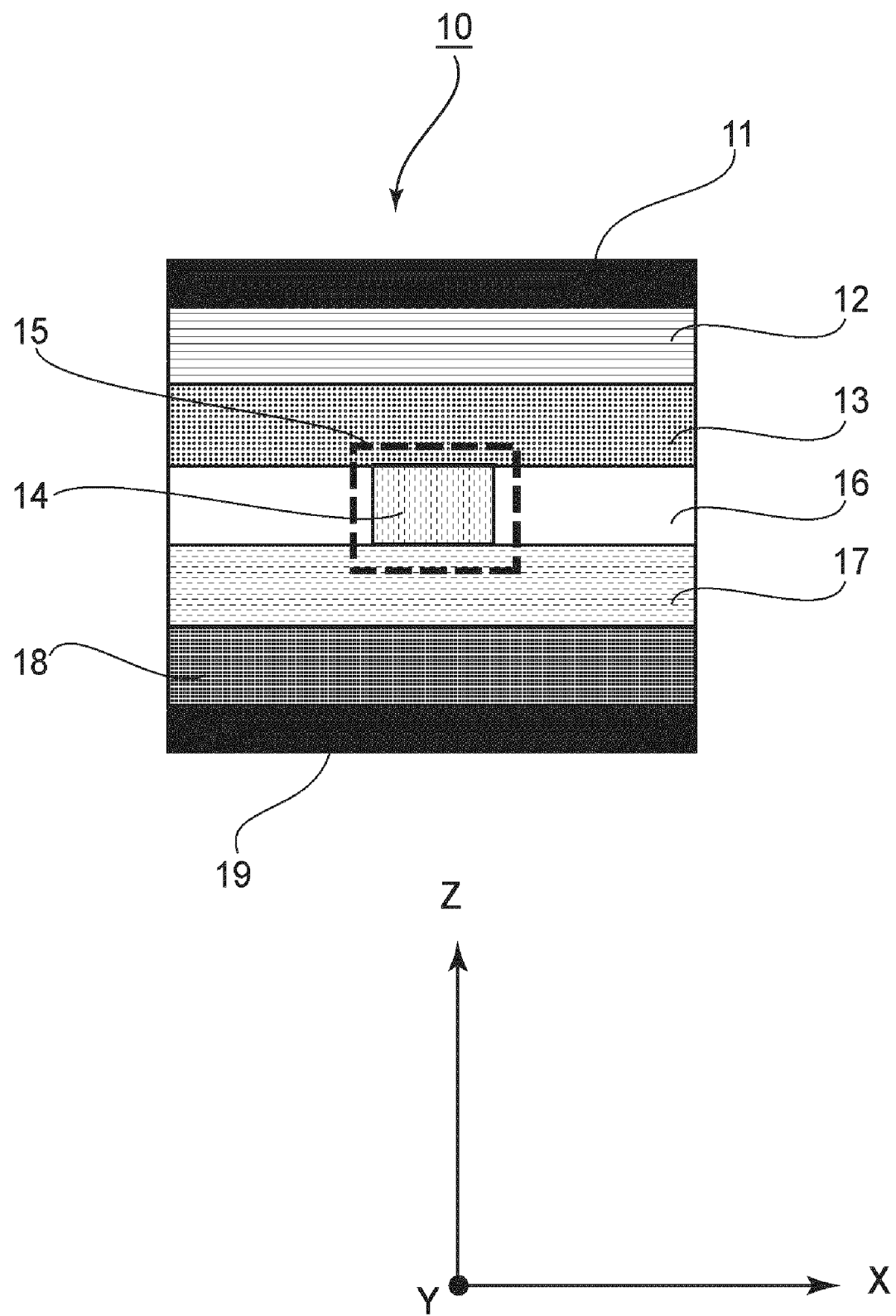
FIG. 1 is a schematic and sectional view of a light emitting device according to a first embodiment of the present invention.
Figure 2A:
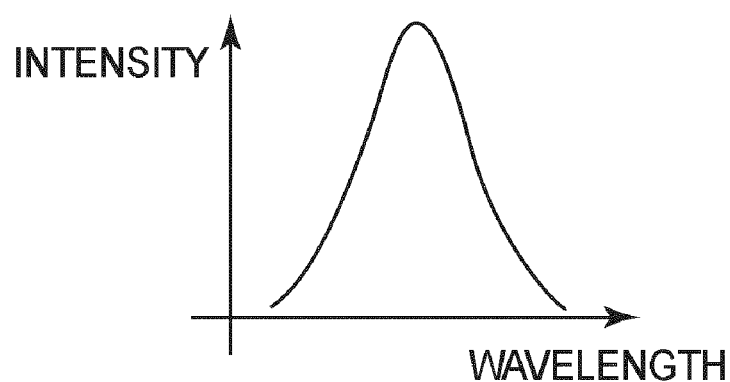
FIG. 2A to FIG. 2D are diagrams for explaining spectrums of a conventional LD.
Figure 2B:
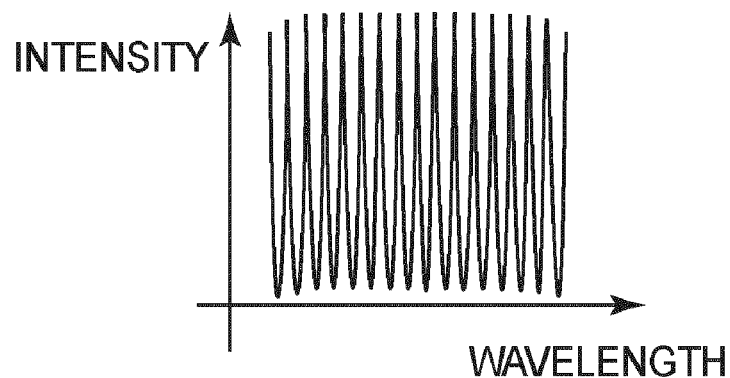
Figure 2C:
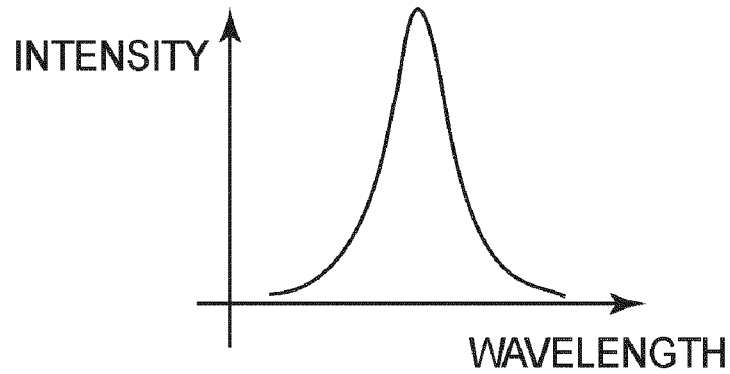
Figure 2D:
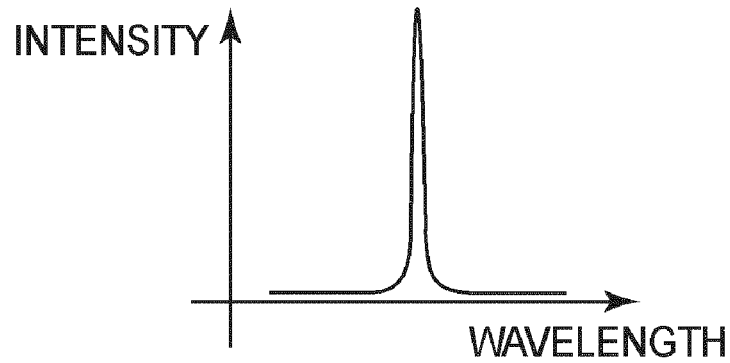

FIG. 1 is a schematic and sectional view of a light emitting device according to a first embodiment of the present invention.

The light emitting device 10 shown in FIG. 1 comprises a p-type electrode (electrode member) 11, a p-type contact layer 12, a p-type clad member 13, an active member 14, a single-mode resonator 15, an insulation 16, an n-type clad member 17, an n-type contact layer 18, and an n-type electrode (electrode member) 19.

Except the electrode members 11 and 19, these components are provided by a three-dimensional photonic crystal. The resonator 15 has an isolated point defect that disturbs the refractive-index periodic structure of the photonic crystal.

Electron holes are injected from the p-type electrode 11, while electrons are injected from the n-type electrode 19. Through the contact layers 12 and 18 and clad members 13 and 17, carriers are injected into the active member 14. Based on the coupling of injected carriers, light is produced. The light is confined by resonator 15 and resonance and amplification are carried out, such that laser oscillation is produced. The insulation 16 provides a current stricture structure, by which the carriers are efficiently injected into the active member 14. The active member 14 is formed by $In_{0.28}Ga_{0.72}N$, and the band-gap energy is 500 nm. The photonic band gap of the photonic crystal ranges from the wavelength 460 nm to the wavelength 540 nm. The peak wavelength of the resonance spectrum of the resonator 15 is set to 520 nm. With the structure described above, a light emitting device providing high-efficiency green light emission is realized, while avoiding difficulties involved in the prior art described hereinbefore.

Next, the operational principle of the light emitting device 10 of the present embodiment will be explained in conjunction with a conventional LD.

FIG. 2A to FIG. 2D are schematic diagrams for explaining spontaneous emission spectrum (FIG. 2A), resonance spectrum (FIG. 2B), gain spectrum (FIG. 2C), and emission spectrum (FIG. 2D) in a conventional LD. In ordinary LDs, of the spontaneous emission light (FIG. 2A) which is the source of light, the light having a wavelength matching the resonance mode of the resonator is confined in the resonator. And if the active member of the resonator has a high gain in that wavelength, stimulated emission occurs and laser oscillation is produced.

Namely, laser oscillation (FIG. 2D) is produced at the wavelength which is determined by the relationship between the gain spectrum (FIG. 2C) and the resonance spectrum (FIG. 2B) of the resonator. The gain spectrum is represented by the product of the occupation probability depending on the quasi Fermi level and the energy state density of carrier and the carrier momentum matrix element. For the gain spectrum peak, the wavelength is approximately determined by the state density which is defined by the band-gap energy, and a shift occurs in dependence upon the occupation probability which is regulated by the quasi Fermi level related to the carrier density.

Furthermore, the intra-band relaxation which is represented by a line form function contributes to the spread of the gain spectrum shape. More specifically, the peak wavelength of the gain spectrum largely depends on the band-gap energy and, as a result, the emission wavelength approximately coincides with its original emission wavelength as determined by the band-gap energy of the active member. It is to be noted that, when the band-gap energy is Eg (unit is eV), the original emission wavelength λ (unit is nm) of the active member is represented by λ=1240/Eg. Furthermore, assuming that the bowing parameter is 1, the theoretical value of the band-gap energy Eg of the $In_xGa_{1-x}N$ active member can be represented by Equation 1, below.

$$Eg = Eg1 \cdot x + Eg2 \cdot (1-x) - x \cdot (1-x) \quad (1)$$

wherein Eg1 denotes the band-gap energy (0.8 eV) of InN, and Eg2 denotes the band-gap energy (3.4 eV) of GaN.

For example, the emission wavelength λ is 407 nm when the In composition ratio x is 0.1. If the In composition ratio x is 0.3, the emission wavelength λ is 515 nm. It is to be noted that the amount of spreading of the gain spectrum is different depending on the carrier density and the structure of the active layer. The full width at half maximum is around 40 nm in the case of a double-hetero (DH) structure, and it is around 10 to 20 nm in the case of a quantum well structure.

As described above, in ordinary LDs, except less than the oscillation threshold, the spontaneous emission spectrum does not much contribute to the oscillation spectrum. This is because there is little limitation with respect to the state of light to produce by the interband relaxation of carrier which represents the spontaneous emission process.

As a result, the spontaneous emission spectrum largely depends on the state of carrier and, additionally, the spontaneous emission coefficient which corresponds to the rate of contribution to the stimulated emission among the spontaneous emission light, becomes very low. Since spontaneous emission light of a wavelength different from the resonance mode occurs in the active member, the light other than the emission wavelength directly leads to a loss of energy, and it causes efficiency degradation.

Therefore, in ordinary LDs, amplification which exceeds the energy loss including spontaneous emission has to be done. Hence, it is necessary to match the peak wavelength of the gain spectrum determined by the band-gap energy and the peak wavelength of the resonance spectrum.

With the conventional LD structure, even if the wavelength determined by the band-gap energy of the active member is set to be shorter than the peak wavelength of the resonance spectrum of the resonator, since the loss is too large, light emission is unattainable.

Furthermore, with currently available production methods, when a high-quality film usable for a laser is produced, the upper limit of the In composition ratio x is around 0.25. Therefore, the limit of the emission wavelength at the long-wavelength side would be around 480 nm.

Figure 3A:
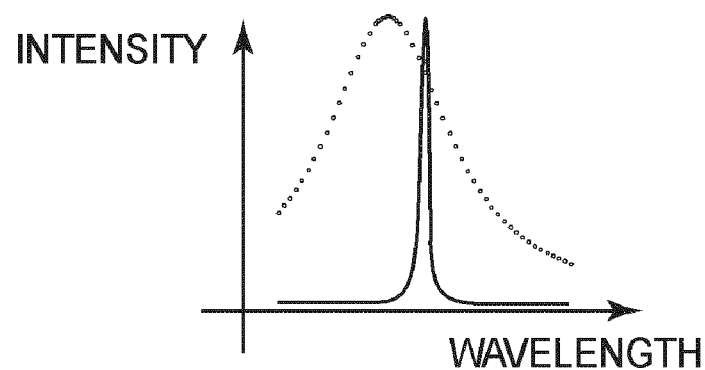
FIG. 3A to FIG. 3D are diagrams for explaining spectrums of a light emitting device according to the present invention.

FIG. 3A-FIG. 3D are schematic diagrams for explaining spontaneous emission spectrum (FIG. 3A), resonance spectrum (FIG. 3B), gain spectrum (FIG. 3C) and the emission spectrum (FIG. 3D) in the light emitting device 10 according to the present embodiment. In FIG. 3A, the solid line of the spontaneous emission spectrum depicts the actual spectrum, and the dotted line depicts the spectrum when a photonic crystal resonator is unused.

In the light emitting device using a micro-resonator based on a photonic crystal, the state of light to be produced by the interband relaxation of carrier is firmly restrained. Since in the photonic crystal resonator the energy state that the light is able to take is limited, the energy difference between the carriers produced by the interband relaxation is restricted. As a result, the spontaneous emission spectrum (FIG. 3A) is restricted.

Figure 3B:
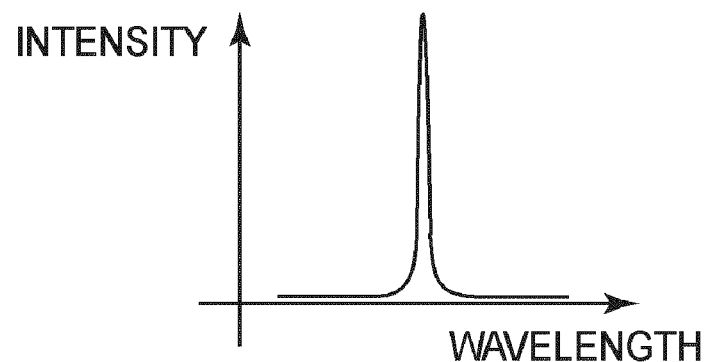
Figure 3C:
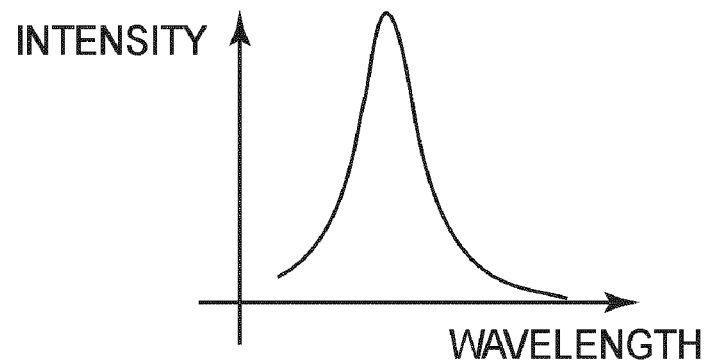
Figure 3D:
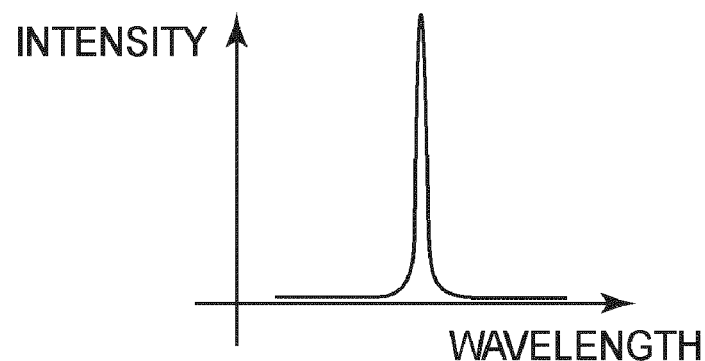

Therefore, the spontaneous emission spectrum has approximately the same spectral line shape as the resonance spectrum (FIG. 3B).

More specifically, the spontaneous emission coefficient becomes approximately equal to 1 and, thus, the spontaneous emission spectrum and the stimulated emission spectrum (oscillation spectrum) have approximately the same spectral line shape.

As a result, no light other than the resonance mode would be produced even if the peak wavelength $\lambda=1240/Eg$ of the gain spectrum (FIG. 3C) determined by the band-gap energy Eg is shifted toward a wavelength side shorter than the peak wavelength of the resonance spectrum. For this reason, efficient light emission (FIG. 3D) is enabled.

Even if the wavelength determined by the band-gap energy Eg of the active member 14 is set at a shorter-wavelength side (e.g. around 500 nm) so as to obtain green light emission (e.g. wavelength 520 nm), efficient light emission is still obtainable.

Namely, the In composition ratio x of the active member 14 comprised of InGaN can be kept at a low value and, as a result, no crystal defect occurs and long life-time and high-efficiency light emission is obtainable.

Since such restraint acts also on the restraint to transition through the defect level caused by the crystal defect during manufacture, the influence thereof is reduced even if there is a crystal defect. Hence, high-efficiency light emission is accomplished.

As described above, in this embodiment, the peak wavelength ($\lambda=1240/Eg$) of the gain spectrum determined by the band-gap energy Eg of the active member is set to be shorter than the peak wavelength of the resonance spectrum of the resonator. With this arrangement, the spontaneous emission light is controlled by the photonic crystal resonator, and a light emitting device capable of efficiently emitting green light is realized.

For the material of the clad members 13 and 17 in FIG. 1, a medium having a band-gap energy larger than the medium which forms the active member 14 is used. Based on this, a double-hetero structure is provided, and the carrier confinement effect and light confinement effect are improved. Hence, the energy efficiency is enhanced.

More specifically, GaN, AlGaN, or InGaN having an In composition ratio lower than the medium which forms the active member 14 may be used.

In the first embodiment shown in FIG. 1, a wavelength 520 nm is used as the emission wavelength. However, the present invention is not limited to this. The wavelength may be determined in the wavelength range from 500 nm to 550 nm which range corresponds to the region as can be recognized as green.

Furthermore, since the above-described principle is not limited to the wavelength of green light, the emission wavelength may be a long wavelength greater than 550 nm. Furthermore, although a value 0.28 is used for the In composition ratio x, the invention is not limited to this. It can be determined while taking into account the spread of the gain spectrum and the emission wavelength.

Particularly, when an In composition ratio x not less than 0.25 is used, the light emission occurs at a comparatively high gain position. Thus, high-efficiency light emission is obtainable. Namely, a condition:

$0.25 \leq x \leq 1$ should preferably be satisfied.

The value of In composition ratio x can be controlled at a resolution of 0.01. Therefore, the band-gap energy can be controlled at a resolution around 2 nm in terms of the wavelength.

Since the In composition ratio x of active member 14 can be held low, the difference between the wavelength determined by the band-gap energy of the active member 14 and the peak wavelength of the resonance mode specifying the emission wavelength should desirably be made large, preferably not less than 5 nm.

More preferably, the difference of the peak wavelength should be 10 nm or more. This facilitates the manufacture of the light emitting device. However, if the difference of wavelength is too large, the value of gain at the peak wavelength of the resonance mode will decrease, and the luminous efficiency will be lowered.

In consideration of the amount of spreading of the gain spectrum, the difference of wavelength should desirably be kept not greater than 50 nm. Furthermore, nitride semiconductors such as InAlN or InAlGaN, for example, having band-gap energy at the same level as InGaN may be used for the active member 14.

Furthermore, although in the first embodiment shown in FIG. 1, a three-dimensional photonic crystal is used, a two-dimensional photonic crystal may be used. When such two-dimensional photonic crystal is used, the structure should be made to assure that, with respect to a direction in which no refractive index periodic structure is provided, the light is confined by the total reflection based on the refractive index difference. However, in the two-dimensional photonic crystal, the suppression effect for the spontaneous emission based on the photonic crystal resonator is not available with regard to the one direction in which no refractive index periodic structure is provided. Therefore, to obtain a higher suppression effect and enhanced efficiency, use of a three dimensions photonic crystal is desirable.

From the standpoint of operational stability, the resonance mode of the photonic crystal resonator should be a single mode inside the photonic band gap. However, even in the case of multiple modes, if there is a resonance mode at the long-wavelength side where the gain of the active member is lower than the value at the emission wavelength, it is still acceptable since the laser oscillation occurs only by the wavelength of higher gain.

Furthermore, although in the first embodiment shown in FIG. 1, all the components other than the electrode members 11 and 19 are formed by a photonic crystal, only a portion having a light confining function may be formed by a photonic crystal. For example, the portions (e.g. clad members 13 and 17, insulating member 16 and active member 14) other than the electrode members 11 and 19 and contact members 12 and 18 may be formed by a photonic crystal.

Furthermore, as described above, the suppression effect to spontaneous emission through the resonator having a photonic crystal acts also on the defect level based on the crystal defect. Therefore, even if a tensile-strained quantum well is introduced, degradation of the efficiency can be reduced. Hence, the wavelength may be made longer while using a tensile-strained quantum well, and an InGaN active member having a lower In composition ratio x may be used.

As described above, the light emitting device 10 of the present embodiment has a resonator 15 which comprises a photonic crystal having a refractive index periodic structure and providing a photonic band gap, as well as an isolated defect member in the photonic crystal for disturbing the refractive index periodic structure. Furthermore, it comprises an active member 14 having InGaN, provided inside the resonator 15.

The wavelength $\lambda_1 = 500$ nm determined by the band-gap energy of the active member 14 is included in the photonic band gap range of 460 nm to 540 nm of the photonic crystal. Furthermore, the wavelength 500 nm determined by the band-gap energy of the active member 14 is set to be shorter than the peak wavelength $\lambda_2 = 520$ nm of the shortest-wavelength side of the resonance mode which the resonator 15 bears inside the photonic band gap range of 460 nm to 540 nm.

Based on this, a light emitting device capable of efficiently emitting green light is accomplished.

Embodiment 2

Next, a specific example of a photonic crystal resonator structure of a light emitting device according to a second embodiment of the present invention will be explained.

Figure 4:
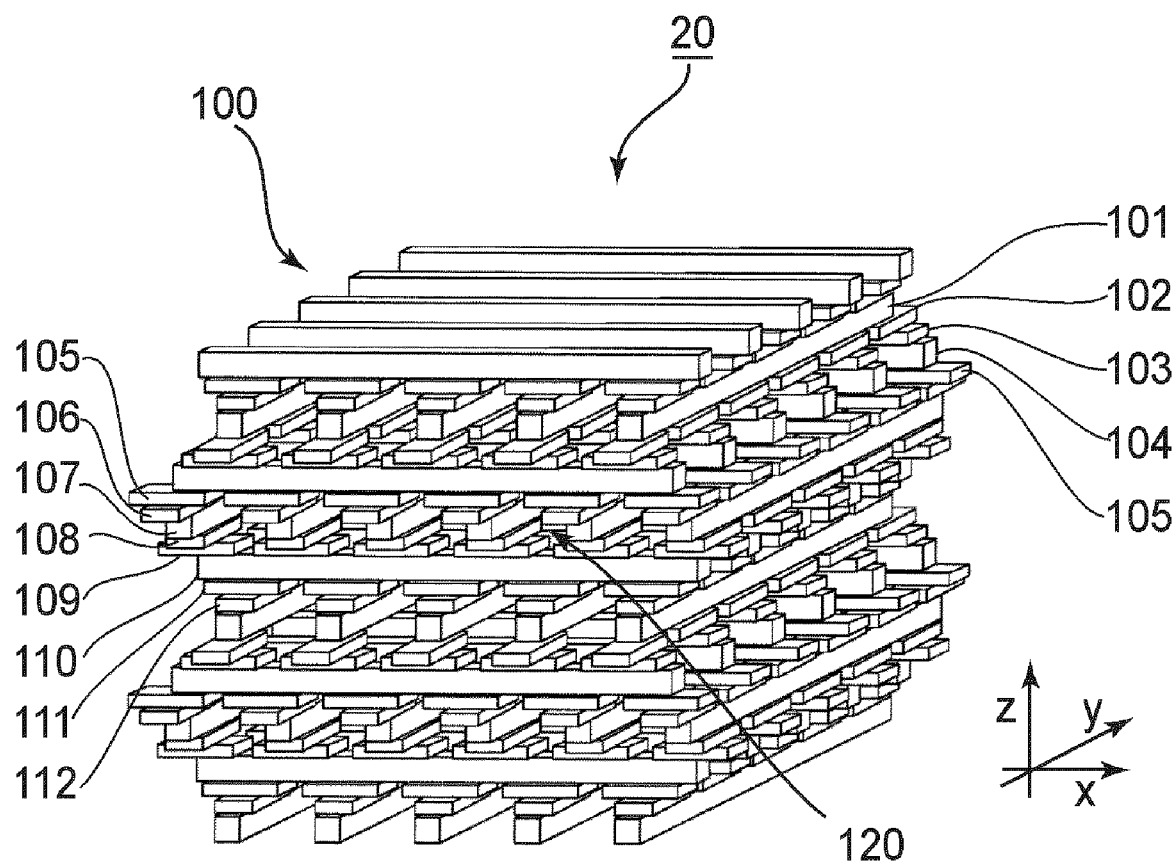
FIG. 4 is a diagram for explaining a three-dimensional photonic crystal according to a second embodiment of the present invention.

FIG. 4 is schematic diagram of a main portion of the resonator used in the light emitting device of the second embodiment of the present invention. The resonator 20 comprises a periodic structure member 100 and a point defect member 120 formed therein. The periodic structure member 100 has a layered structure in z direction, having a basic period which comprises 12 levels of layers 101-112 including the x-y plane.

Figure 5:
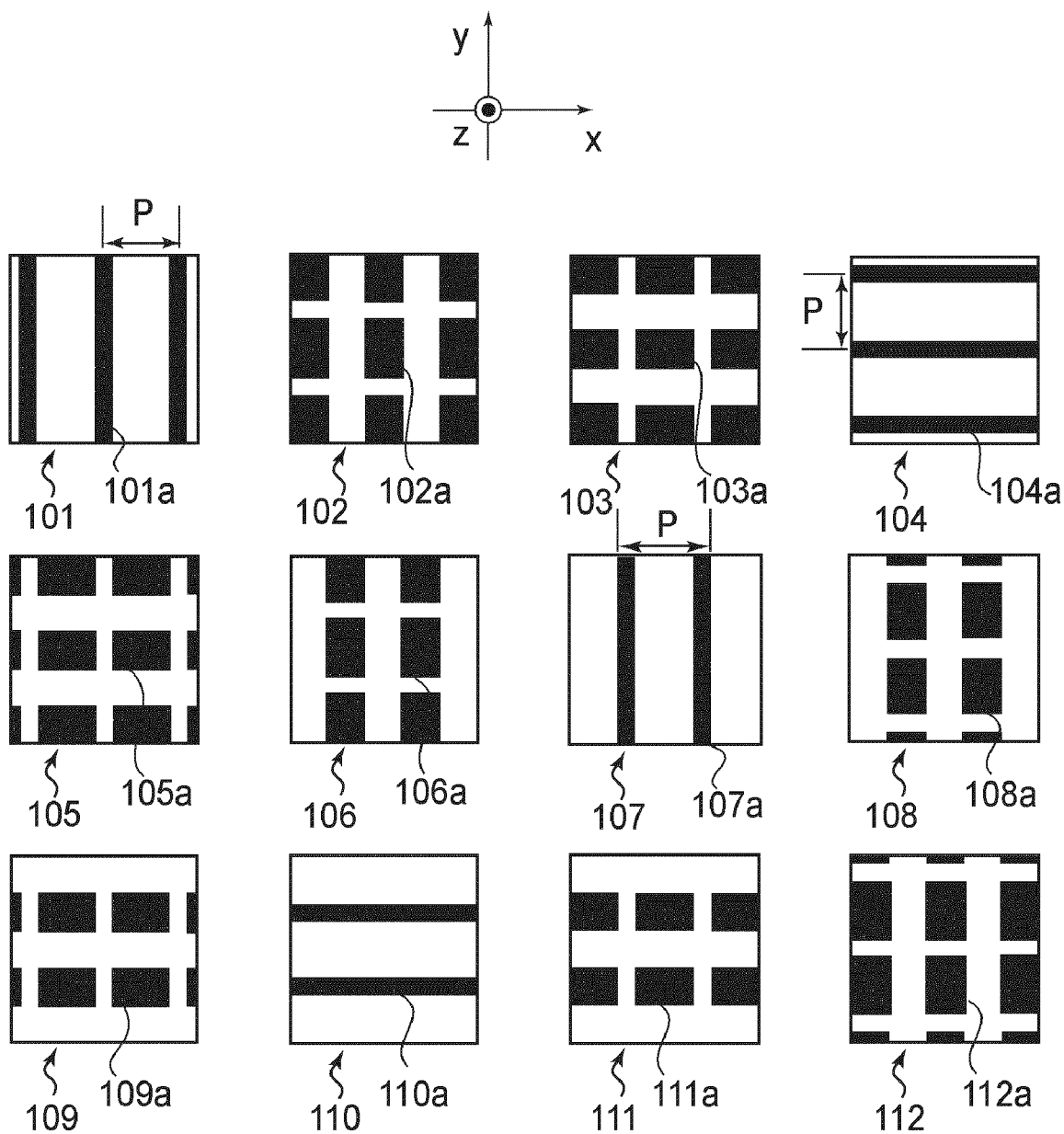
FIG. 5 is a diagram for explaining layers of the three-dimensional photonic crystal according to the second embodiment of the present invention.

FIG. 5 is a schematic diagram showing a portion of the layers 101-112 along the x-y section. The first layer 101 and the seventh layer 107 are provided with a plurality of columnar structures 101a and 107a which extend in parallel to the y-axis and which are made of a first medium having a high refractive index, the columnar structures being formed with a regular pitch P in the x direction. The columnar structures 101a and the columnar structures 107a are formed at positions which are mutually shifted by P/2 in the x-axis direction. On the other hand, the fourth layer 104 and the tenth layer 110 are provided with a plurality of columnar structures 104a and 110a which extend in parallel to the x axis and which are made of the first medium, the columnar structures being formed with a regular pitch P in the y direction. The columnar structures 104a and the columnar structures 110a are formed at positions which are mutually shifted by P/2 in the y-axis direction.

The second layer 102 and the third layer 103 are added layers sandwiched between the first and fourth layers 101 and 104.

The fifth layer 105 and the sixth layer 106 are added layers sandwiched between the fourth and seventh layers 104 and 107.

The eighth layer 108 and the ninth layer 109 are added layers sandwiched between the seventh and tenth layers 107 and 110.

The eleventh layer 111 and the twelfth layer 112 are added layers sandwiched between the tenth layer 110 and the first layer (first layer corresponding to the next basic period).

The second layer 102 and the third layer 103 constituting the added layers are provided with discrete structures 102a and 103a, respectively, which are made of the first medium and disposed at positions corresponding to the intersecting points of the columnar structures 101a of the first layer 101 and the columnar structures 104a of the fourth layer 104.

The discrete structures 102a and 103a are disposed discretely so that they do not contact each other in the x-y plane.

It is to be noted that the discrete structures 102a and 103a are symmetric with each other so that they overlap each other when rotated by 90 degrees along the x-y plane.

Similarly, the fifth layer 105, sixth layer 106, eighth layer 108, ninth layer 109, eleventh layer 111 and twelfth layer 112 which are sandwiched between layers having columnar structures and constitute added layers, are provided with discrete structures 105a, 106a, 108a, 109a, 111a and 112a.

The discrete structures 105a, 106a, 108a, 109a, 111a, 112a are formed by first mediums disposed discretely in x-y plane at positions corresponding to the intersecting points of the columnar structures in the layer adjoining thereto.

The columnar structures and the discrete structures in each layer contact each other, and the portions in each layer other than these columnar structures and the discrete structures are filled with a second medium having a lower refractive index. By optimizing the refractive indices of the first and second mediums as well as the shape and pitch of the columnar structures and discrete structures and the thickness of each layer, a complete photonic band gap can be obtained at a desired frequency spectrum (wavelength region) and in a very wide frequency band (wavelength band).

In this embodiment, the first medium has a refractive index 3.0, and the second medium has a refractive index 1. When the spacing of the columnar structures is P, the thickness of all the layers 101, 104, 107 and 110 having columnar structures, in the z-axis directions, may be equal to 0.15*P, and the thickness of all the layers 102, 103, 105, 106, 108, 109, 111 and 112 having discrete structures, in the z direction, may be equal to 0.1*P.

Each columnar structure may comprise a rectangular prism having a length 0.15*P at one side of its section, along the z direction, and a length 0.25*P in the x or y direction.

Furthermore, each discrete structure may comprise a rectangular parallelepiped having a rectangular shape with lengths 0.35*P and 0.65*P at its sides in the x-y section and a thickness 0.1*P in the z direction.

Figure 6:
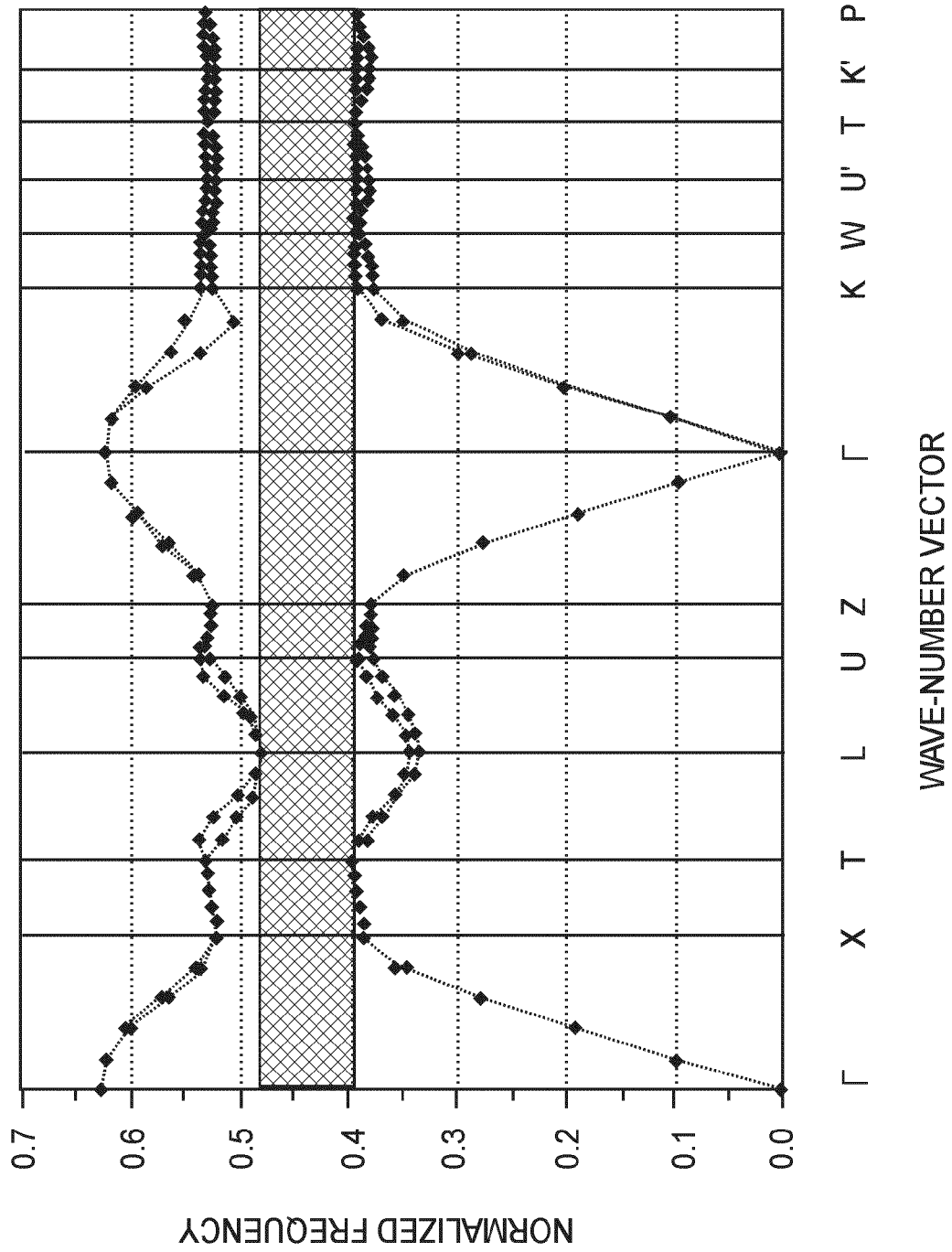
FIG. 6 is a graph for explaining the normalized frequency of the three-dimensional photonic crystal according to the second embodiment of the present invention.

FIG. 6 shows the results of analysis to the photonic band structure described above, made on the basis of the plane wave expansion method.

In FIG. 6, the axis of abscissas denotes the wave vector, that is, the incidence direction of electromagnetic waves being incident on the photonic crystal.

For example, point K depicts the wave vector parallel to the x axis (or y axis) and point X depicts the wave vector having a tilt of 45 degrees with respect to the x-axis (or y axis) in the x-y plane.

On the other hand, the axis of ordinate denotes the frequency (normalized frequency) being standardized by the lattice period. In the region of the normalized frequency from 0.395 to 0.479 which is illustrated by hatching in FIG. 6, no light can exist irrespective of the direction of incidence of the light. Thus, a complete photonic band gap is created there. If the pitch P of the columnar structures is 235 nm, then a complete photonic band gap is produced in the wavelength region from a wavelength 490 nm to a wavelength 595 nm.

Figure 7:
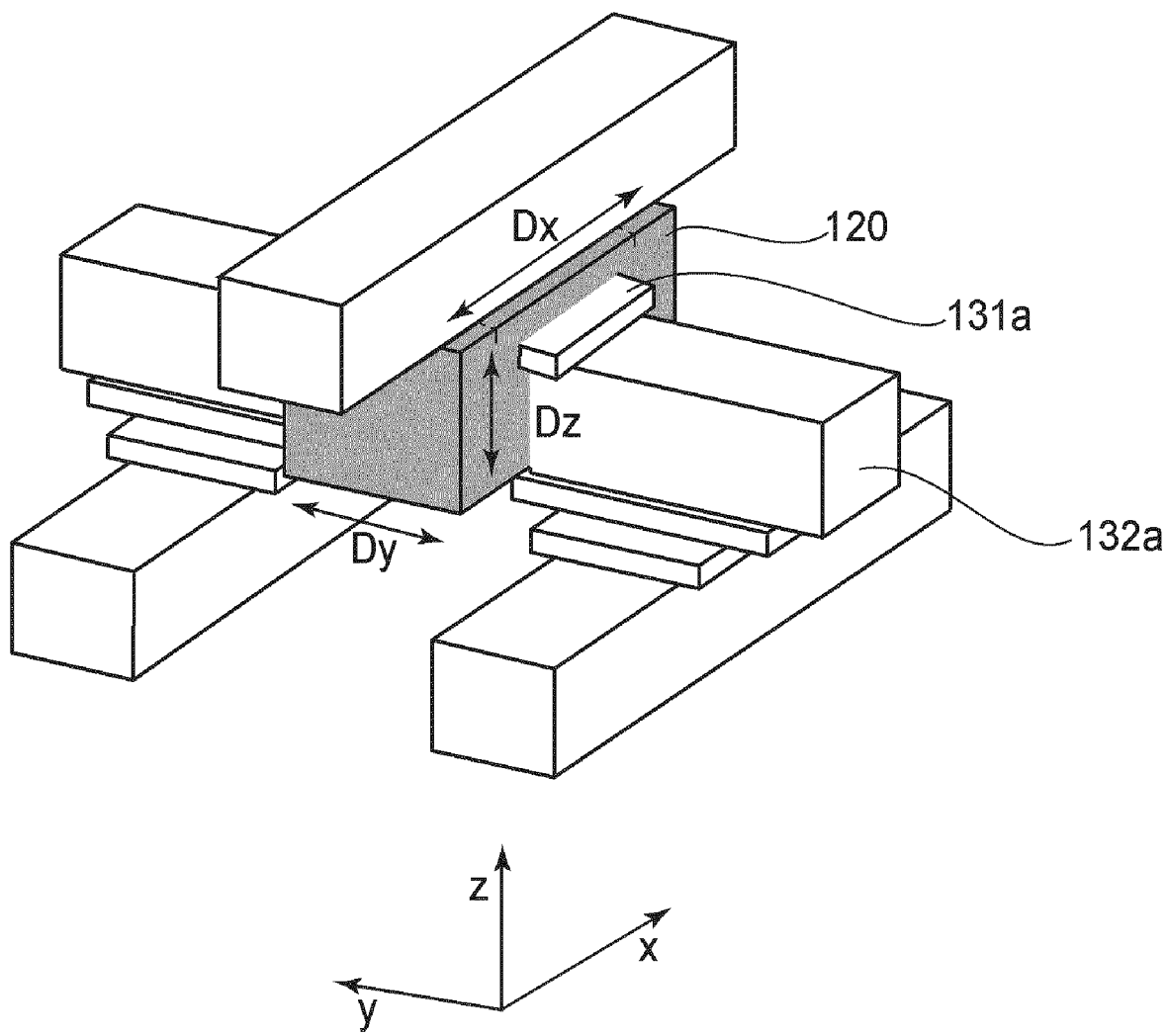
FIG. 7 is an enlarged view of a portion of FIG. 4.

FIG. 7 is an enlarged view of a portion around the point defect member 120 shown in FIG. 4. The point defect member 120 is made of a first medium having a refractive index 3.0, and it has a rectangular parallelepiped shape having a thickness Dz and widths Dx and Dy. By forming the point defect member 120 in this manner, it is assured that, for electromagnetic waves in some of the wavelength region within the wavelength region of the photonic band gap of the periodic structure member 100, the electromagnetic waves can be present only in the point defect member. Thus, the electromagnetic waves are confined in a very small region, and a high-performance resonator having good confinement effect is accomplished.

In FIG. 7, the point defect member 120 is so formed that the center coordinates of the point defect member 120 with respect to the x direction and the y direction coincide with the center coordinates of the discrete structure 131a with respect to the x direction and the y direction, respectively.

With regard to the z direction, the smallest coordinate of the point defect member 120 in the z direction coincides with the smallest coordinate of the columnar structure 132a in the z direction. By forming the point defect member with a shape of Dx=0.95*P, Dy=0.35*P and Dz=0.35*P, it is assured that only one defect mode exist in the photonic band gap. Namely, the single mode is achieved.

The point defect member 120 is so formed to extend over a layer having a discrete structure and a layer having a columnar structure. formed. Taking into account the manufacturing process, it is desirable that the thickness Dz of the point defect member 120 corresponds to the sum of the layer thickness including a discrete structure or a columnar structure. Furthermore, the defect structure may be formed to include at least one layer having a discrete structure and being thinner that the layer having a columnar structure. This enables much closer control of the defect mode frequency.

Figure 8:
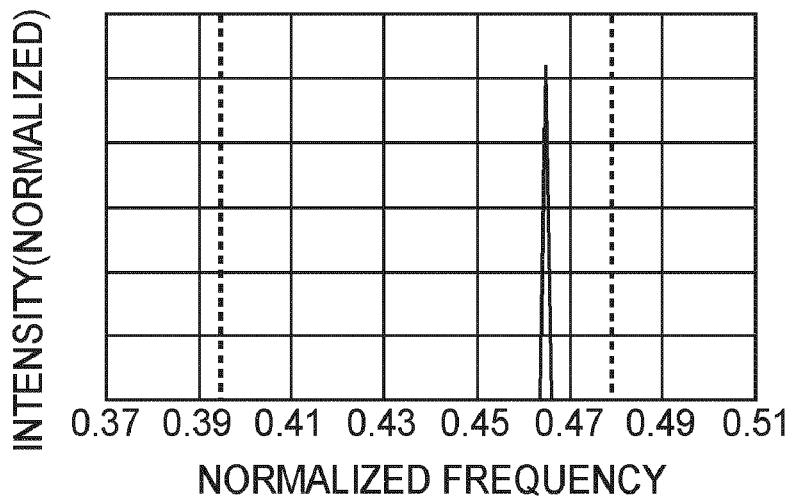
FIG. 8 is a graph for explaining the spectrum in a defect mode in the second embodiment of the present invention.

FIG. 8 is a graph for explaining the spectrum of defect mode where a periodic structure member 100 is provided with thirteen periods in the x direction and six periods in the z direction, and a point defect member 120 is disposed at the center thereof. It is seen from FIG. 8 that a single-mode resonator is realized.

The Q-value ("energy accumulated in the resonator" divided by "energy lost from the resonator per unit time") which represents the optical confinement performance of the resonator based on the defect mode shown in FIG. 8, is about 20,000. This value can be increased exponentially by increasing the number of periods of the periodic structure member 100. Therefore, the number of periods of the periodic structure member 100 should be not less than the minimum number of periods providing a desired confinement effect.

Although in the present embodiment there are two layers having a discrete structure to constitute the added layers, one level of layer or three or more levels of layers may be used for this. A complete photonic band gap is obtainable in a large frequency bandwidth, when at least one level of layer is included.

Embodiment 3

Next, a specific example of a photonic crystal resonator structure of a light emitting device according to a third embodiment of the present invention will be explained.

Figure 9:
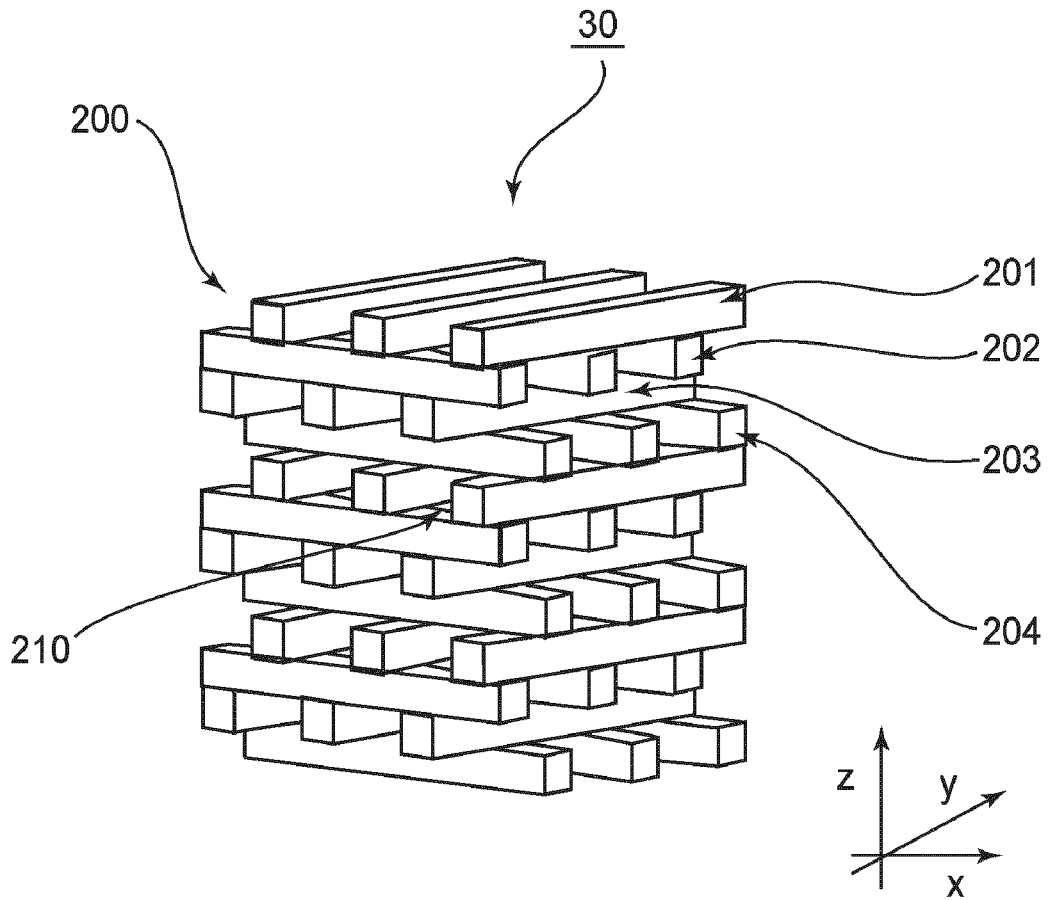
FIG. 9 is a diagram for explaining a three-dimensional photonic crystal according to a third embodiment of the present invention.

FIG. 9 is schematic diagram of a main portion of the resonator used in the light emitting device of the third embodiment of the present invention. The resonator 30 comprises a periodic structure member 200 and a point defect member 210 formed therein. The periodic structure member 200 has a basic period defined by four layers 201-204 including the x-y plane, which are sequentially stacked.

Figure 10:
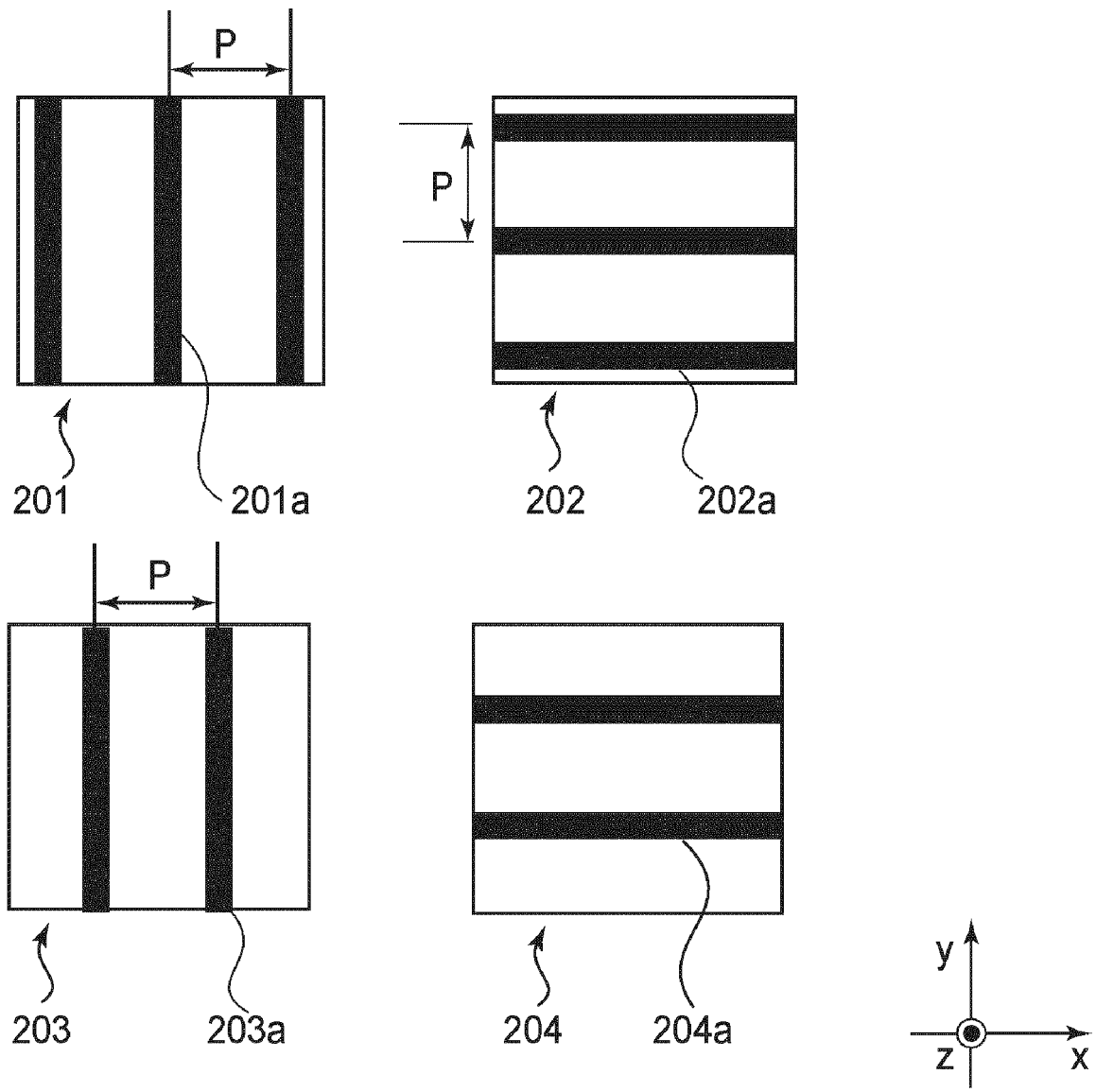
FIG. 10 is a diagram for explaining layers of the three-dimensional photonic crystal according to the third embodiment of the present invention.

FIG. 10 is a schematic diagram showing a portion of the layers 201-204 along the x-y section. The first layer 201 and the third layer 203 are provided with a plurality of columnar structures 201a and 203a which extend in parallel to the y-axis and which are made of a first medium having a higher refractive index, the columnar structures being formed with a regular pitch P in the x direction which is a direction perpendicular to the direction of elongation of the columnar structures 201a and 203a.

The columnar structures 201a and the columnar structures 203a are formed at positions which are mutually shifted by P/2 in the x-axis direction (i.e. a half of the pitch P of the columnar structures 201a and 203a).

On the other hand, the second layer 202 and the fourth layer 204 are provided with a plurality of columnar structures 202a and 204a which extend in parallel to the x axis and which are made of the first medium, the columnar structures being formed with a regular pitch P in the y direction. The columnar structures 202a and the columnar structures 204a are formed at positions which are mutually deviated by P/2 in the y-axis direction. The portion of the layers 201-204 except the columnar structures 201a-204a is filled with a second medium having a lower refractive index.

By optimizing the refractive indices of the first and second mediums as well as the shape and pitch of the columnar structures and the thickness of each layer, a complete photonic band gap is obtainable at a desired frequency spectrum (wavelength region) and in a very wide frequency band (wavelength band).

Figure 11:
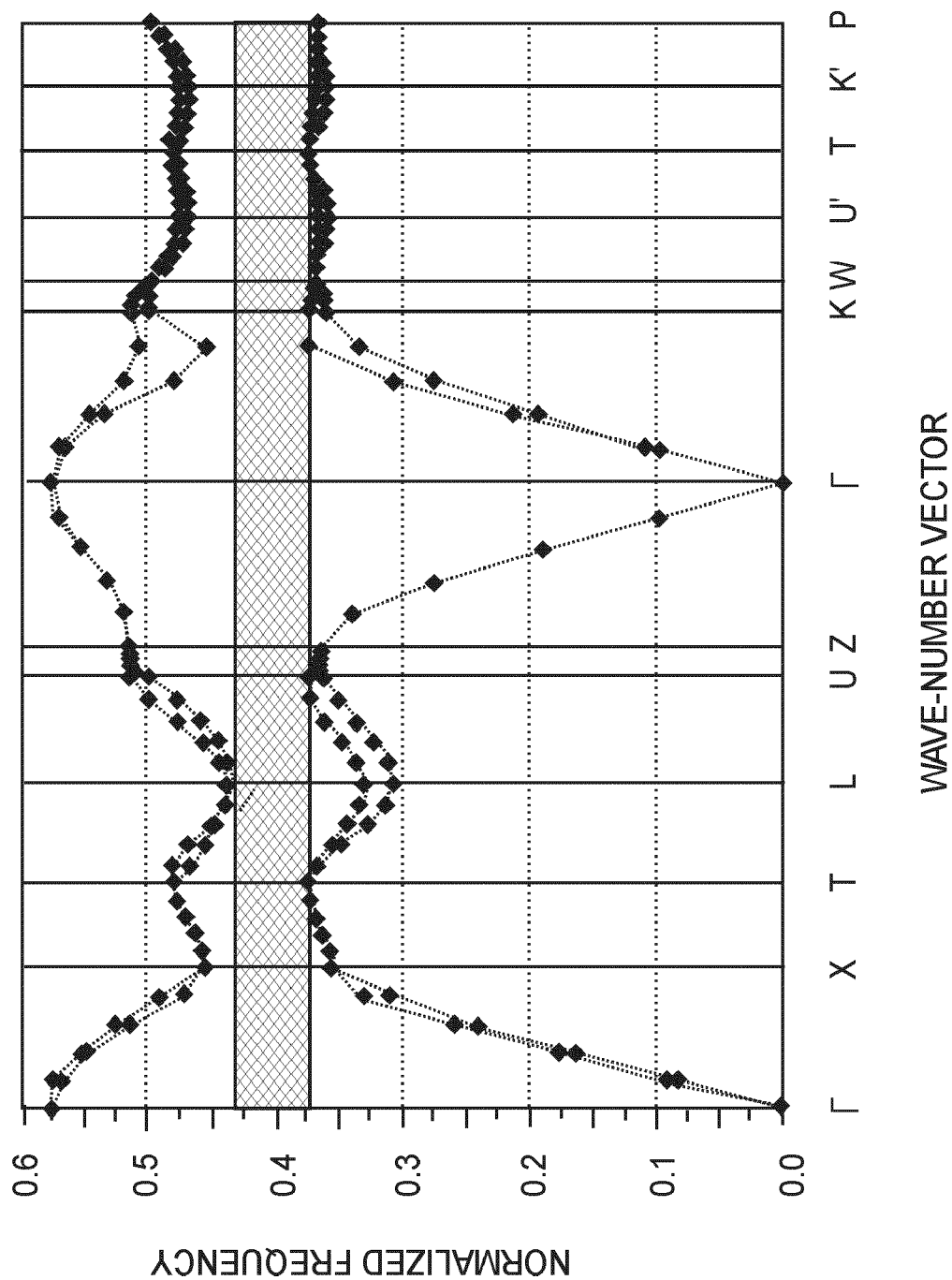
FIG. 11 is a graph for explaining the normalized frequency of the three-dimensional photonic crystal according to the third embodiment of the present invention.

In this embodiment, the first medium has a refractive index 3.0, and the second medium has a refractive index 1. When the spacing of the columnar structures is regular and takes a value P, each columnar structure may comprise a rectangular prism having a length 0.3*P at one side of its section, along the z-axis direction, and a length 0.35*P in the x or y direction. FIG. 11 shows the results of analysis to the photonic band structure described above, made on the basis of the plane wave expansion method.

In the region of the normalized frequency from 0.374 to 0.433 which is illustrated by hatching in FIG. 11, no light can exist irrespective of the direction of incidence of the light. Thus, a complete photonic band gap is created there. If the pitch P of the columnar structures 201a is 215 nm, then a complete photonic band gap is produced in the wavelength region from a wavelength 496 nm to a wavelength 575 nm.

Figure 12:
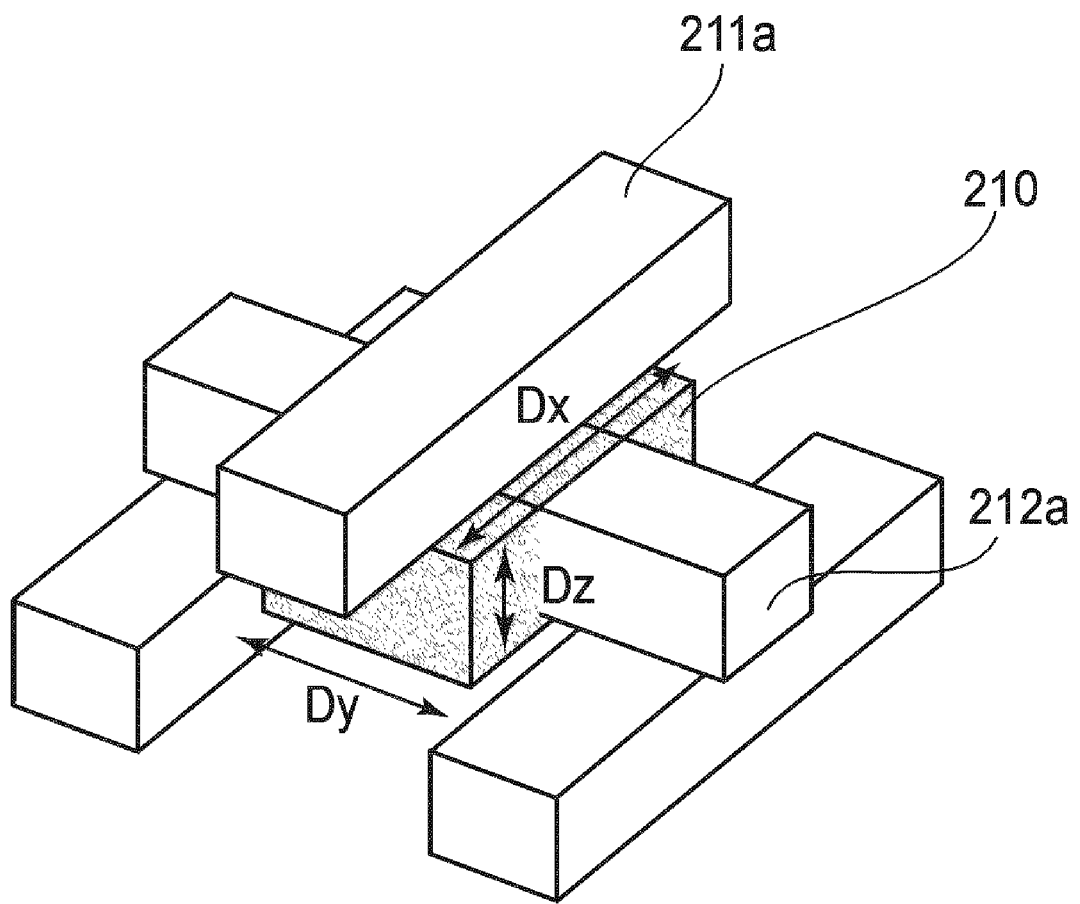
FIG. 12 is an enlarged view of a portion of FIG. 9.

FIG. 12 is an enlarged view of a portion around the point defect member 210 shown in FIG. 9. The point defect member 210 is made of the same medium as the columnar structures 211a and 212a, and it has a rectangular parallelepiped shape of a thickness Dz and widths Dx and Dy, including one columnar structure.

By forming the point defect member 210 in this manner, it is assured that, for electromagnetic waves in some of the wavelength region within the wavelength region of the photonic band gap of the periodic structure member 200, the electromagnetic waves can be present only in the point defect member 210. Thus, the electromagnetic waves are confined in a very small region, and a high-performance resonator having good confinement effect is accomplished.

In FIG. 12, the point defect member 120 is so formed that the center coordinate of the point defect member 210 with respect to the x direction coincides with the center coordinate of the columnar structure 212a and that the center coordinate of the point defect member 210 with respect to the y direction coincides with the center coordinate of the columnar structure 211a with respect to the y direction.

With regard to the z direction, the largest coordinate of the point defect member 210 in the z direction coincides with the largest coordinate of the columnar structure 212a in the z direction. By forming the point defect member with a shape of Dx=0.95*P, Dy=0.35*P and Dz=0.3*P, it is assured that only one defect mode exist in the photonic band gap. Namely, the single mode is achieved.

Figure 13:
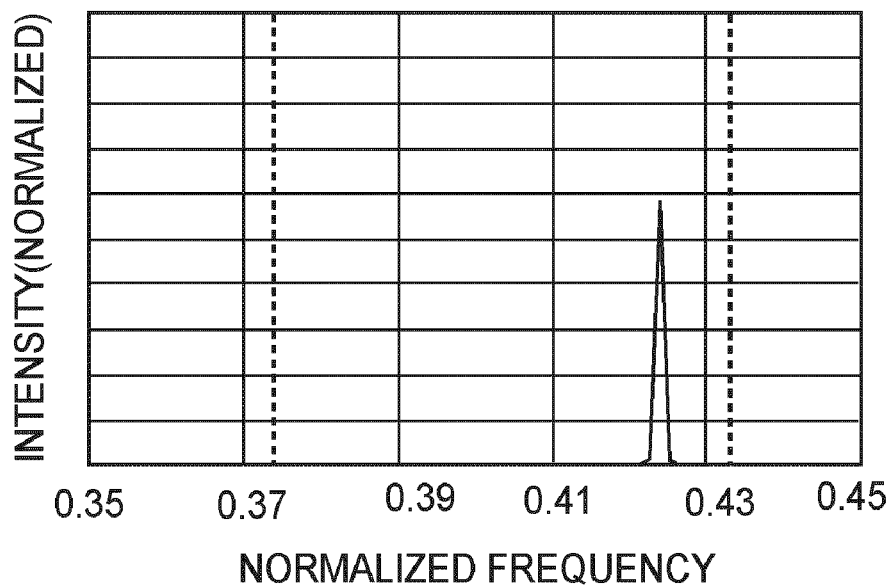
FIG. 13 is a graph for explaining the spectrum in a defect mode in the third embodiment of the present invention.

FIG. 13 is a graph for explaining the spectrum of defect mode where a periodic structure member 200 is provided with eight periods in the x and y directions and four periods in the z direction, and a period defect member 210 is disposed at the center thereof. It is seen from FIG. 13 that a single-mode resonator is realized by the present embodiment.

Embodiment 4

Figure 14:
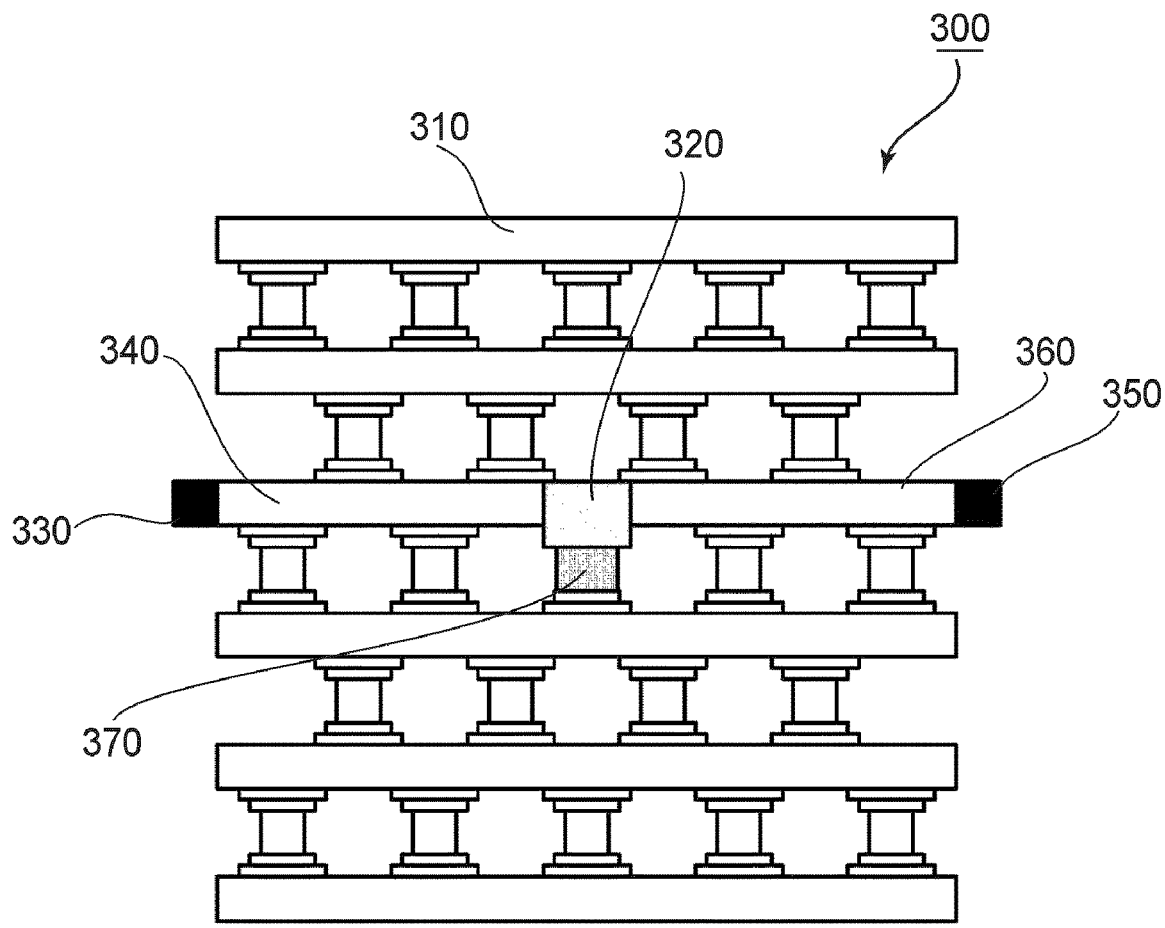
FIG. 14 is a sectional view of a main portion of a light emitting device according to a fourth embodiment of the present invention.

FIG. 14 is a sectional view of a main portion of a light emitting device (laser device) according to a fourth embodiment of the present invention. In FIG. 14, denoted at 300 is a light emitting device.

Denoted at 320 is a resonator with a point defect member formed inside a periodic structure 310 and having a structure similar to that of the second or third embodiment of the present invention. The light emitting device 300 comprises a resonator 320, a p-type electrode 330, a p-type carrier conducting pathway 340, an n-type electrode 350, an n-type carrier conducting pathway 360, and a waveguide 370. Formed inside the resonator 320 is an InGaN active member which presents a light emitting function in response to the carrier injection.

The waveguide 370 is a line defect waveguide formed by providing a linear defect member for disturbing the period, inside the periodic structure member 310. The wave-guiding mode thereof may be determined, while taking into account the resonance mode of the resonator 320, and by optimizing the shape and refractive index of the line defect member to assure improved coupling efficiency with the resonator 320. The linear defect may be defined by changing the shape or refractive index of the columnar structure inside the periodic structure member 310 or by adding columnar structures.

Electron holes are injected into the resonator 320 through the p-type electrode 330 and p-type carrier conducting pathways 340. Electrons are supplied into the resonator 320 through the n-type electrode 350 and n-type carrier conducting pathways 360. These are coupled together inside the resonator to cause light emission. Thus laser oscillation occurs and light is extracted outwardly (y direction) through the waveguide 370.

With the light emitting device according to the present embodiment, based on the principle of the first embodiment, a light source capable of efficiently emitting green light can be realized, while overcoming the difficulties involved in the prior art.

Embodiment 5

Figure 15:
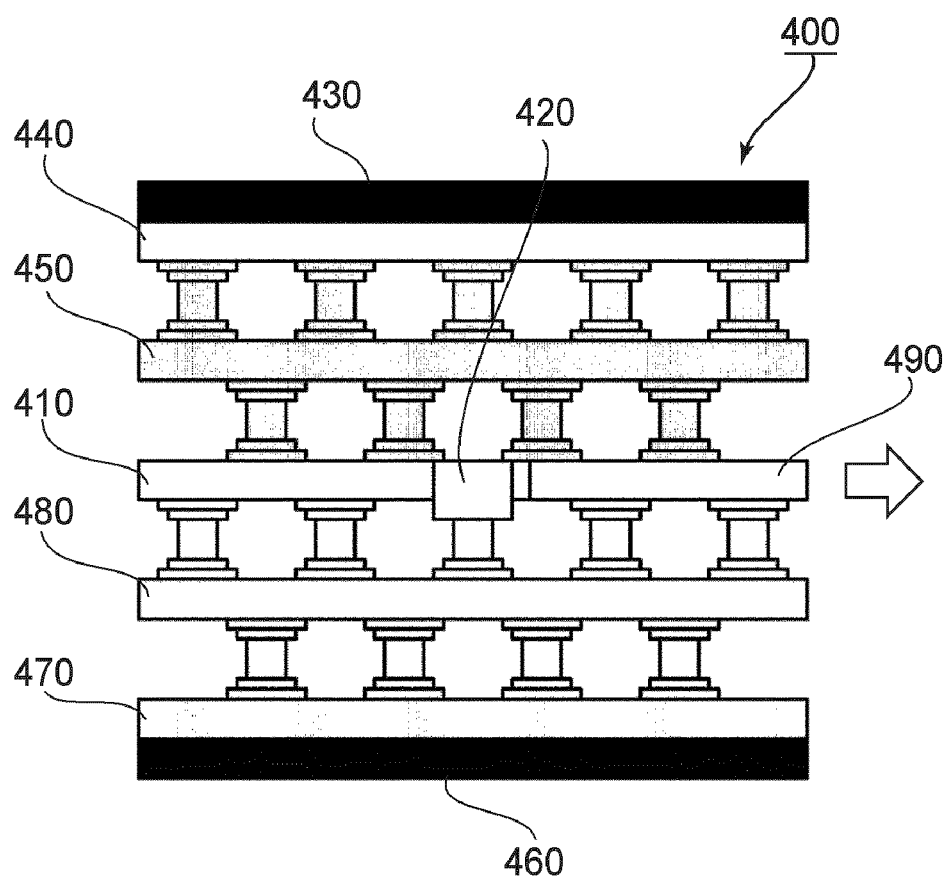
FIG. 15 is a sectional view of a main portion of a light emitting device according to a fifth embodiment of the present invention.

FIG. 15 is a sectional view of a main portion of a light emitting device (laser device) according to a fifth embodiment of the present invention. In FIG. 15, denoted at 400 is a light emitting device.

Denoted at 420 is a resonator with a point defect member formed inside a periodic structure 410 and having a structure similar to that of the second or third embodiment of the present invention. The light emitting device 400 comprises a resonator 420, a p-type electrode 430, a p-type contact layer 440, a p-type clad member 450, an n-type electrode 460, an n-type contact layer 470, an n-type clad member 480 and a waveguide 490.

Formed inside the resonator 420 is an InGaN active member which presents a light emitting function in response to the carrier injection. The waveguide 490 is a line defect waveguide formed by providing a linear defect member for disturbing the period, inside the periodic structure member 410.

Electron holes are supplied into the resonator 420 through the p-type electrode 430, p-type contact layer 440, and p-type clad member 450. Electrons are supplied into the resonator 420 through the n-type electrode 460, n-type contact layer 470, and n-type clad member 480. The electron holes and the electrons supplied into the resonator 420 are coupled together, and light emission and laser oscillation are produced. Thus, light is extracted outwardly through the waveguide 490.

With the light emitting device 400 according to the present embodiment, based on the principle of the first embodiment, a light source capable of efficiently emitting green light can be realized, while overcoming the difficulties involved in the prior art.

Embodiment 6

Figure 16:
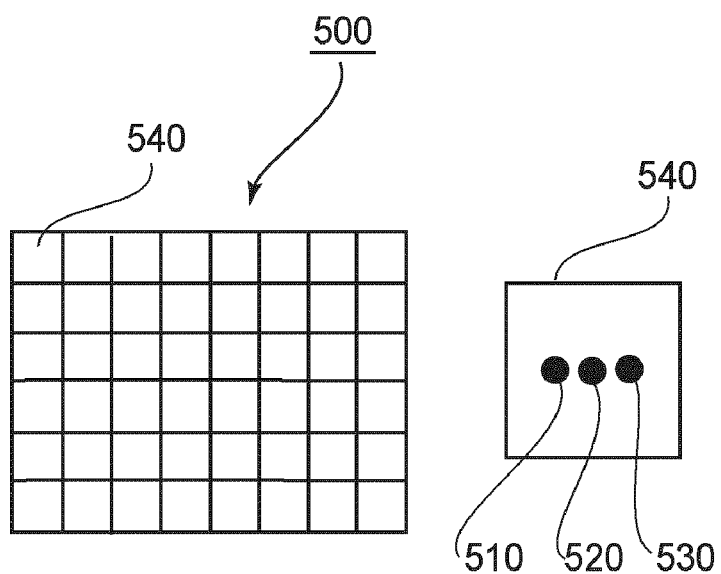
FIG. 16 is a diagram for explaining a display device according to the present invention.

FIG. 16 is schematic diagram of a main portion of a display device according to a sixth embodiment of the present invention. In FIG. 16, denoted at 500 is a display device.

The display device 500 has a unit pixel constituted by a picture element structure 540 which comprises a light emitting device 510 of the present invention for emitting green light, a light emitting device 520 for emitting red light, and a light emitting device 530 for emitting blue light. The display device comprises a plurality of the picture element structures 540 which are arrayed two-dimensionally. With this arrangement, a high-efficiency and high-luminance display device having a wide color reproduction range is accomplished.

Embodiment 7

Figure 17A:
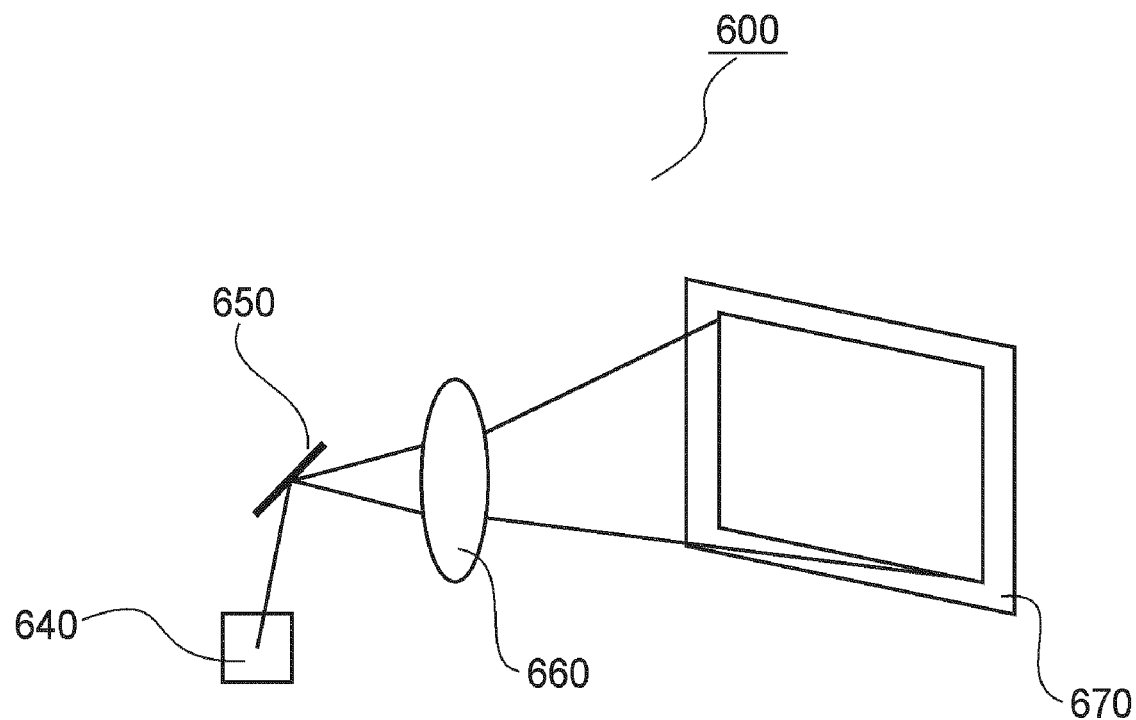
FIG. 17A and FIG. 17B are diagrams for explaining a display unit according to the present invention.
Figure 17B:
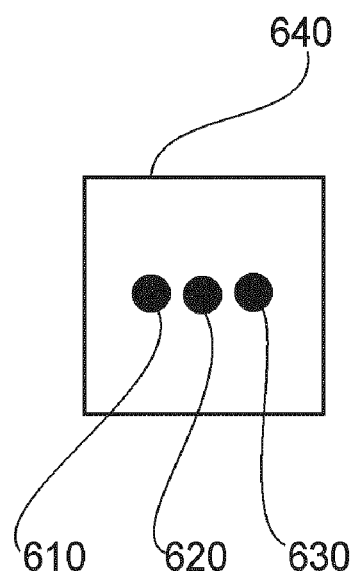

FIG. 17A and FIG. 17B is schematic diagram of a main portion of a display unit which uses light emitting devices according to the present invention.

Denoted in FIG. 17A and FIG. 17B at 600 is a display unit. The display unit 600 comprises an RGB light source 640 (FIG. 17B) which includes a light emitting device 610 of the present invention for emitting green light, a light emitting device 620 for emitting red light, and a light emitting device

630 for emitting blue light, wherein these light emitting devices are disposed close to each other or coupled together by mean of a dichroic mirror.

In the display unit of the present embodiment, the output light emitted from the RGB light source 640 being modulated based on the imagewise information is scanned by a scan mirror 650, to display a two-dimensional image on a screen 670 through a projection lens 660. With this structure, a high-efficiency and high-luminance display device having a wide color reproduction range is accomplished.

It is a possible alternative form of the display unit according to the present embodiment that, in place of projecting an image on the screen 670, an image is projected directly on a retina of an observer for observation.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2006-262378 filed Sep. 27, 2006, for which is hereby incorporated by reference.

What is claimed is:

1. A light-emitting device, comprising:
   a resonator including a photonic crystal having a refractive-index periodic structure and a point defect member formed in the photonic crystal; and
   an active member provided inside the resonator and formed of an In-containing nitride semiconductor;
   wherein a wavelength determined by a band gap energy of the active member is included in a photonic band gap range of the photonic crystal, and is set to be shorter than a peak wavelength at a shortest-wavelength side of a resonance mode in the photonic band gap range.

2. A light-emitting device according to claim 1, wherein there is a difference not smaller than 5 nm between the wavelength determined by the band gap energy and the peak wavelength of the resonance mode.

3. A light-emitting device according to claim 1, wherein, in the photonic band gap range, the resonator has a single mode.

4. A light-emitting device according to claim 1, wherein a peak wavelength for a light-emission wavelength is not smaller than 500 nm.

5. A light-emitting device according to claim 1, wherein the active member contains InGaN, and wherein, when a composition of the InGaN is represented by $In_xGa_{1-x}N$, a relation $0.25 \leq x \leq 1$ is satisfied.

6. A light-emitting device according to claim 1, further comprising a double-hetero structure including a p-type clad member and an n-type clad member disposed to sandwich the active member and made of a medium having a band gap energy larger than that of the active member.

7. A light-emitting device according to claim 1, wherein the light-emitting device provides a laser.

8. A light-emitting device according to claim 1, wherein the photonic crystal is a three-dimensional photonic crystal.

9. A light-emitting device according to claim 8,
   wherein the three-dimensional photonic crystal includes a first layer having a plurality of first columnar structures arrayed with a first predetermined pitch, a second layer having a plurality of second columnar structures extending in a direction different from that of the plurality of first columnar structures and arrayed with a second predetermined pitch, a third layer having a plurality of third columnar structures extending in a same direction as that of the plurality of first columnar structures and arrayed with the first predetermined pitch, and a fourth layer having a plurality of fourth columnar structures extending in a same direction as that of the plurality of second columnar structures and arrayed with the second predetermined pitch,
   wherein the plurality of first columnar structures and the plurality of third columnar structures provided at the first and third layers are mutually deviated shifted in a direction perpendicular to an elongation direction of these columnar structures by an amount corresponding to half of the first predetermined pitch,
   wherein the plurality of second columnar structures and the plurality of fourth columnar structures provided at the second and fourth layers are mutually shifted in a direction perpendicular to an elongation direction of these columnar structures by an amount corresponding to half of the second predetermined pitch, and
   wherein the first to fourth layers are sequentially stacked.

10. A light-emitting device according to claim 8,
    wherein the three-dimensional photonic crystal includes a first layer having a plurality of first columnar structures arrayed with a first predetermined pitch, a second layer having a plurality of second columnar structures extending in a direction different from that of the plurality of first columnar structures and arrayed with a second predetermined pitch, a third layer having a plurality of third columnar structures extending in a same direction as that of the first columnar structures and arrayed with the first predetermined pitch, a fourth layer having a plurality of fourth columnar structures extending in a same direction as the plurality of second columnar structures and arrayed with the second predetermined pitch, and at least one added layer including a discrete structure being discretely disposed in a plane parallel to any one of the first to fourth layers,
    wherein the plurality of first columnar structures and the plurality of third columnar structures provided at the first and third layers are mutually shifted in a direction perpendicular to an elongation direction of these columnar structures by an amount corresponding to half of the first predetermined pitch,
    wherein the plurality of second columnar structures and the plurality of fourth columnar structures provided at the second and fourth layers are mutually shifted in a direction perpendicular to an elongation direction of these columnar structures by an amount corresponding to half of the second predetermined pitch,
    wherein the first to fourth layers are sequentially stacked, and
    wherein the discrete structure of the added layer is disposed at a position corresponding to a point of intersection of the columnar structures.

11. A light-emitting device as recited in claim 1, wherein the light-emitting device is incorporated in a display device.

12. A light-emitting device as recited in claim 1, wherein the light-emitting device is incorporated in a display unit.

* * * * *